US006605961B1

United States Patent
Forbes

(10) Patent No.: US 6,605,961 B1
(45) Date of Patent: Aug. 12, 2003

(54) LOW VOLTAGE PLA'S WITH ULTRATHIN TUNNEL OXIDES

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/515,759

(22) Filed: Feb. 29, 2000

(51) Int. Cl.$^7$ .............................................. H03K 19/177
(52) U.S. Cl. ............................. 326/41; 326/39; 326/40; 326/101; 257/315
(58) Field of Search ........................... 326/40, 41, 101, 326/39; 438/264; 365/185.17; 257/315, 321

(56) References Cited

U.S. PATENT DOCUMENTS

| | | | |
|---|---|---|---|
| 3,387,286 A | 6/1968 | Dennard | 340/173 |
| 4,051,354 A | 9/1977 | Choate | 235/312 |
| 4,313,106 A * | 1/1982 | Hsu | 365/185.17 |
| 4,471,240 A | 9/1984 | Novosel | 307/463 |
| 5,105,388 A * | 4/1992 | Itano et al. | 365/189.08 |
| 5,327,380 A | 7/1994 | Kersh, III et al. | 365/195 |
| 5,455,791 A * | 10/1995 | Zaleski et al. | 365/185.26 |
| 5,464,785 A * | 11/1995 | Hong | 436/264 |
| 5,555,206 A | 9/1996 | Uchida | 365/149 |
| 5,559,449 A * | 9/1996 | Padoan et al. | 326/40 |
| 5,608,670 A | 3/1997 | Akaogi et al. | 365/185.23 |
| 5,671,178 A | 9/1997 | Park et al. | 365/185.22 |
| 5,706,227 A * | 1/1998 | Chang et al. | 365/185.18 |
| 5,740,104 A | 4/1998 | Forbes | 365/185.03 |
| 5,754,477 A | 5/1998 | Forbes | 365/185.33 |
| 5,790,455 A | 8/1998 | Caywood | 365/185.96 |
| 5,801,401 A | 9/1998 | Forbes | 257/77 |
| 5,852,306 A | 12/1998 | Forbes | 257/315 |
| 5,936,274 A | 8/1999 | Forbes et al. | 257/315 |
| 5,959,896 A | 9/1999 | Forbes | 365/185.33 |
| 5,973,356 A | 10/1999 | Noble et al. | 257/319 |
| 5,991,225 A | 11/1999 | Forbes et al. | 365/230.06 |
| 6,049,477 A * | 4/2000 | Taira | 365/145 |
| 6,100,559 A * | 8/2000 | Park | 257/314 |
| 6,124,729 A * | 9/2000 | Noble et al. | 326/41 |
| 6,137,725 A | 10/2000 | Caser et al. | 365/185.23 |
| 6,222,224 B1 * | 4/2001 | Shigyo | 257/315 |
| 6,246,089 B1 * | 6/2001 | Lin et al. | 257/315 |

FOREIGN PATENT DOCUMENTS

JP            60046125 A * 3/1985 ................. 326/44

OTHER PUBLICATIONS

Rhyne, Fundamentals of Digital Systems Design, NJ. 1973. pp 70–71.*

Ohguro, T., et al., "Tenth Micron P–MOSFET's with Ultra–Thin Epitaxial Channel Layer Grown by Ultra–High Vacuum CVD", *Proceedings: International Electron Devices Meeting, IEEE*, Washington, Dec. 5–8, 1993, pp. 433–436, (Dec. 5, 1993).

(List continued on next page.)

Primary Examiner—Michael G. Lee
Assistant Examiner—Steven S. Paik
(74) Attorney, Agent, or Firm—Schwegman, Lundberg, Woessner & Kluth, P.A.

(57) ABSTRACT

Systems and methods for programmable logic arrays having depletion mode, non volatile p-channel floating gate transistors with ultra thin tunnel oxides are provided. The programmable logic arrays of the present invention can be programmed with voltages of 2.0 to 3.0 Volts and the normal operating voltages on the control gates are of the order 1.0 Volt. The depletion mode, non volatile p-channel floating gate transistors the present invention, include a range of floating gate potentials over which charge can not leak on to or off of the floating gate. The non volatile p-channel floating gate transistors in the programmable logic array include an oxide layer of less than 50 Angstroms (Å) which separates the floating gate from a p-type doped channel region separating a source and a drain region in a substrate.

59 Claims, 10 Drawing Sheets

OTHER PUBLICATIONS

Frank, D.J., et al., "Monte Carlo Simulations of p–and n–channel Dual–Gate Si MOSFET's at the Limits of Scaling", *IEEE Transactions on Electron Devices,* 40(11), p. 2103, (Nov. 1993).

"Frequently–Asked Questions (FAQ) About Programmable Logic", http://www.OptiMagic.com/faq.html, 15 pages, (1997).

Chen, I. et al., "A Physical Model for the Gate Current Injection in p–Channel MOSFET's", *IEEE Electron Device Letters,* 14(5), 228–230, (May 1993).

Chen, J., et al., "Hot Electron Gate Current and Degradation in P–Channel SOI MOSFET's", *1991 IEEE International SOI Conference Proceedings,* Vail Valley, Colorado, 8–9, (Oct. 1–3, 1991).

Dipert, B., et al., "Flash Memory Goes Mainstream", *IEEE Spectrum,* 30, 48–52, (Oct. 1993).

Ghodsi, R., et al., "Gate–Induced Drain–Leakage in Buried–Channel PMOS–A Limiting Factor in Development of Low–Cost, High–Performance 3.3–V, 0.25–um Technology", *IEEE Electron Device Letters,* 19 (9), 354–356, (Sep. 1998).

Hodges, D.A., et al., "Analysis and Design of Digital Integrated Circuits", McGraw–Hill Book Company, 2nd Edition, 394–396, (1988).

Moore, W.R., "A Reviw of Fault–Tolerent Techniques for the Enhancement of Integrated Circuit Yield", *Proceedings of the IEEE,* 74(5), 684–698, (May 1986).

Muller, D.A., et al., "The Electronic Structure at the Atomic Scale of Ultrathin Gate Oxides", *Nature,* 399, 758–761, (Jun. 1999).

Ohnakado, T., et al., "1.5V Operation Sector–Erasable Flash Memory with BIpolar Transistor Selected (BITS) P–Channel Cells", *1998 Symposium on VLSI Technology; Digest of Technical Papers,* 1998 VLSI Technology Symposium, Honolulu, 14–15, (1998).

Ohnakado, T., et al., "Novel Electron Injection Method Using Band–to–Band Tunneling Induced Hot Electron (BBHE) for Flash Memory with a P–Channel Cell", *IEEE International Electron Devices Meeting Technical Digest,* Washington D.C.,, 11.5.1–11.5.4, (1995).

Ohnakado, T., et al., "Novel Self–Limiting Program Scheme Utilizing N–Channel Select Transistors in P–Channel DINOR Flash Memory", *1996 International Electron Devices Meeting Technical Digest,* San Francisco, CA, 7.4.1–7.4.4, (1996).

Papadas, C., et al., "Modeling of the Intrinsic Retention Characteristics of FLOTOX EEPROM Cells Under Elevated Temperature Conditions", *IEEE Transaction on Electron Devices,* 42, 678–682, (Apr. 1995).

Patel, N.K., et al., "Stress–Induced Leakage Current in Ultrathin $SiO_2$ Films", *Appl. Phys. Letters,* 64(14), 1809–1811, (Apr. 4, 1994).

Salm, C., et al., "Gate Current and Oxide Reliability in p+ Poly MOS Capactiors with Poly–Si and Poly–Ge0.3Si0.7 Gate Material", *IEEE Electron Device Letters* 19(7), 213–215 (Jul. 1998).

Shi, Y., "Tunneling Leakage Current in Ultrathin (<4 nm) Nitride/Oxide Stack Dielectrics", *IEEE Electron Devices Letters,* 19(10), 388–390, (Oct. 1998).

Wu, Y., et al., "Time Dependent Dielectric Wearout (TDDW) Technique for Reliability of Ultrathin Gate Oxides", *IEEE Electron Device Letters,* 20(6), 262–264, (Jun. 1999).

* cited by examiner

LOW VOLTAGE PLA'S WITH ULTRATHIN TUNNEL OXIDES

CROSS REFERENCE TO RELATED APPLICATIONS

This application is related to the following co-pending, commonly assigned U.S. patent applications: "Dynamic Flash Memory Cells with UltraThin Tunnel Oxides," Ser. No. 09/513,938, "P-Channe UltraThin Tunnel Oxides," Ser. No. 09/514.627 and each of which disclosure is herein incorporated by reference. This application is further related to the following co-pending, commonly assigned U.S. patent applications: "Static NVRAM with Ultra Thin Tunnel Oxides," Ser. No. 09/515,627, and "Programmable Low Voltage Decode Circuits with UltraThin Tunnel Oxides," Ser. No. 09/515,115, which are filed on even date herewith and each of which disclosure is herein incorporated by reference.

FIELD OF THE INVENTION

The present invention relates generally to semiconductor integrated circuits and, more particularly, to structures and methods for low voltage PLA's with ultra thin tunnel oxides.

BACKGROUND OF THE INVENTION

Electrically erasable and programmable read only memories (EEPROMs) provide nonvolatile data storage. EEPROM memory cells typically use field-effect transistors (FETs) having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. The charge is placed on the floating gate during a write operation using a technique such as hot electron injection or Fowler-Nordheim (FN) tunneling. Fowler-Nordheim tunneling is typically used to remove charge from the polysilicon floating gate during an erase operation. At the present time, FN tunneling is primarily used (see generally, T. P. Ma et al., "Tunneling leakage current in ultrathin (<4 nm) nitride/oxide stack dielectrics," IEEE Electron Device Letters, vol. 19, no. 10, pp. 388–390, 1998) as shown in FIG. 1A where the electrons are injected into the conduction band of the oxide by driving the floating gate with a negative potential. Another type of tunneling which has been used is band to band, BTB, tunneling (see generally C. Salm et al., "Gate current and oxide reliability in P+poly MOS capacitors with poly-Si and Poly-$Ge_{0.3}Si_{0.7}$ gate material," IEEE Electron Device Letters, vol. 19, no. 7, pp. 213–215, July 1998) as shown in FIG. 1B where electrons tunnel out of the valence band, in this case of the silicon substrate, on to the floating gate which is driven to a positive potential.

A flash EEPROM cell has the potential to be smaller and simpler than today's conventional dynamic random access memory (DRAM) cell. One of the limitations to shrinking a flash EEPROM memory cell has been the requirement for a silicon dioxide gate insulator thickness of approximately 10 nm between the floating polysilicon gate and the silicon substrate forming the channel of a flash field effect transistor. This gate thickness is required to prevent excess charge leakage from the floating gate that would reduce data retention time (targeted at approximately 10 years) Current n-channel flash memories utilize a floating polysilicon gate over a silicon dioxide gate insulator of thickness of the order 100 Å or 10 nm in a field effect transistor. (See generally, B. Dipert et al., IEEE Spectrum, pp. 48–52 (Oct. 1993). This results in a very high barrier energy of around 3.2 eV for electrons between the silicon substrate and gate insulator and between the floating polysilicon gate and silicon oxide gate insulator. This combination of barrier height and oxide thickness results in extremely long retention times even at 250 degrees Celsius. (See generally, C. Papadas et al., IEEE Trans. on Electron Devices, 42, 678–681 (1995)). The simple idea would be that retention times are determined by thermal emission over a 3.2 electron volt (eV) energy barrier, however, these would be extremely long so the current model is that retention is limited by F-N tunneling off of the charged gate. This produces a lower "apparent" activation energy of 1.5 eV which is more likely to be observed. Since the retention time is determined either by thermal excitation of electrons over the barrier or the thermally assisted F-N tunneling of electrons through the oxide, retention times are even longer at room temperature and/or operating temperatures and these memories are for all intensive purposes non-volatile and are also known as non volatile random access memories (NVRAMs). This combination of barrier height and tunnel oxide thickness is not an optimum value in terms of transfer of electrons back and forth between the substrate and floating gate and results in long erase times in flash memories, typically of the order of milliseconds. To compensate for this, a parallel erase operation is performed on a large number of memory cells to effectively reduce the erase time, whence the name "flash" or "flash EEPROM" originated since this effective erase time is much shorter than the erase time in EEPROMs.

P-channel flash memory cells, having gate oxide thicknesses of approximately 100 Å, have been reported (see generally, T. Ohnakado et al., Digest of Int. Electron Devices Meeting, Dec. 10–13, 1995, Washington D.C., pp. 279–282; T. Ohnakado et al., Digest of Int. Electron Devices Meeting, Dec. 8–11, 1996, San Francisco, pp. 181–184; T. Ohnakado et al., Proc. Symposium on VLSI Technology, Jun. 9–11, 1998), Honolulu, Hi., pp. 14–15) and disclosed (see U.S. Pat. No. 5,790,455, issued Aug. 4, 1998, entitled "Low voltage single supply CMOS electrically erasable read-only memory"). These reported and disclosed p-channel flash memory cells work similar to n-channel flash memory cells in that they utilize hot electron effects to write data on to the floating gate. If the magnitude of the drain voltage in a PMOS transistor is higher than the gate voltage, then the electric field near the drain through the gate oxide will be from the gate (most positive) towards the drain (most negative). This can and will cause hot electrons to be injected into the oxide and collected by the floating gate. The mechanisms reported are either channel hot electron injection, CHE, or band-to-band tunneling induced hot electron injection, BTB. The gate current in PMOS transistors (see generally, I. C. Chen et al., IEEE Electron Device Lett., 4:5, 228–230 (1993); and J. Chen et al., Proceedings TREE Int. SOT Conf., Oct. 1–3, 1991, pp. 8–9) can actually be much higher than the gate current in NMOS transistors (see generally, R. Ghodsi et al., IEEE Electron Device Letters, 19:9, 354–356 (1998)) due to the BTB tunneling. Negatively, higher gate current in the PMOS transistors resulting from this BTB tunneling effect limits the reliability of deep sub-micron CMOS technology, as reported by R. Ghodsi et al. In other words, the reliability of the PMOS array is lowered because of this higher current in the PMOS device.

In co-pending, commonly assigned U.S. patent applications: entitled "Dynamic Flash Memory Cells with UltraThin Tunnel Oxides," attorney docket no. 303.682US1, Ser. No. 09/513,938, and "P-Channel Dynamic Flash Memory Cells with UltraThin Tunnel Oxides," attorney docket no. 303.684US1, Ser. No. 09/514,627, dynamic memory cells base on floating gates, like those in flash memory cells, over ultrathin tunneling oxides, are disclosed. In these cases write and erase was accomplished by tunneling through the ultrathin gate oxides. The dynamic nature of the cell resulted from using relatively speaking larger potential variations and amounts of charge stored on the floating gates, as a consequence charge could leak on to, or off of, the floating gate by tunneling of carriers to allowed states in the conduction bands of the insulator, FN tunneling, or semiconductor by band to band, BTB, tunneling. The transistors employed there were normal enhancement mode n-channel MOSFETs, or enhancement mode PMOSFETs. However, the dynamic nature of the cells disclosed therein are not suited for the non volatile requirements of programmable logic arrays.

As described above, tunneling has long been used in the erase operation of flash memory devices. Such flash memory devices have further been used in field programmable logic devices such as circuit programmable logic devices, programmable memory address decode and fault-tolerant memory arrays, and embedded functions. However, the use of conventional flash memory devices in such circuit applications suffer the above described drawbacks relating to the speed of the write and erase functions.

Thus, there remains a need in the art to develop "static," non volatile floating gate transistors, or flash memory cells which can be more successfully implemented in programmable logic array circuit applications. Such non volatile floating gate transistors, or flash memory cells should desirably be able to scale down with shrinking design rules and usefully be implemented with ultra thin tunnel gate oxide thicknesses of less than the conventional 100 Å thick tunnel oxides. That is, it is desirable to develop improved programmable logic arrays which are more responsive, providing faster write and erase times and which can work with much lower voltages than conventional flash memory type devices used in current PLA technology. It is further desirable that such programmable logic arrays have a reliability of a number of cycles of performance equivalent or greater than that of current programmable logic arrays using conventional non volatile memory cells and be capable of performing logic operations at a rate comparable to or faster than that of conventional PLA's.

SUMMARY OF THE INVENTION

In the co-filed, co-pending, commonly assigned U.S. patent application: entitled "Static NVRAM Ultra Thin Tunnel Oxides," attorney docket no. 303.680US1, Ser. No. 09/515,630, which disclosure is herein incorporated by reference, static non volatile memory cells, NVRAMs, which behave like SRAMs are disclosed.

The present invention describes systems and methods for programmable logic arrays which utilize such a static non volatile memory cell. The field programmable, in service or in circuit programmable, logic devices of the present invention work with much lower voltages than the normal flash memory type devices used in current PLA technology. They can be programmed with voltages of 2 to 3 Volts and the normal operating voltages on the control gates are of the order 1 Volt or so. The low programming voltage is a consequence of the ultra thin tunnel oxides. The logic devices of the present invention are further capable of performing logic operations at a rate comparable to or faster than that of conventional PLA's and provide much faster write and erase times.

The devices are not similar to normal flash memory devices but rather employ a unique device structure and operating conditions to achieve a nonvolatile memory function. There is a range of floating gate potentials over which charge can not leak off of the floating gate since there are no final states to which the electrons can tunnel to in the silicon substrate. In this manner ultrathin gate oxides can be used as to provide a nonvolatile memory function and the transistor in the logic array can be programmed to perform different logic functions.

According to one embodiment of the present invention, a programmable logic array is provided. The programmable logic array includes a first logic plane that receives a number of input signals. The first logic plane has a plurality of nonvolatile memory cells arranged in rows and columns that are interconnected to provide a number of logical outputs. The programmable logic array also includes a second logic plane which has a number of non-volatile memory cells arranged in rows and columns that receive the outputs of the first logic plane and that are interconnected to produce a number of logical outputs such that the programmable logic array implements a logical function. According to the teachings of the present invention, the non-volatile memory cells each include a depletion mode p-channel memory cell. This depletion mode p-channel memory cell includes a control gate and a floating gate separated from the control gate by a dielectric layer. An oxide layer of less than 50 Angstroms (Å) separates the floating gate from a p-type doped channel region separating a source and a drain region in a substrate.

According to another embodiment of the present invention, a method for operating a programmable logic array having a number of non volatile depletion mode, floating gate, p-channel memory cells with ultra thin oxides is provided. The method includes selectively storing a limited charge on at least one of the floating gates for the number of non volatile depletion mode, floating gate, p-channel memory cells. According to the teachings of the present invention, selectively storing the limited charge on the at least one of the floating gates controls an electrical conduction between a source and a drain region for that non volatile depletion mode, floating gate, p-channel memory cell. In one embodiment, the method also includes selectively removing a limited charge on at least one of the floating gates for the number of non volatile depletion mode, floating gate, p-channel memory cells. According to the teachings of the present invention, selectively removing the limited charge on the at least one of the floating gates effectively removes that non volatile depletion mode, floating gate, p-channel memory cell from the array. The method further includes applying a limited range of floating gate potentials to the number of non volatile depletion mode, floating gate, p-channel memory cells in the array. In one embodiment, applying a limited range of floating gate potentials to the number of non volatile depletion mode, floating gate, p-channel memory cells in the array includes applying a limited range of floating gate potentials of approximately +/−1.0 Volts.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
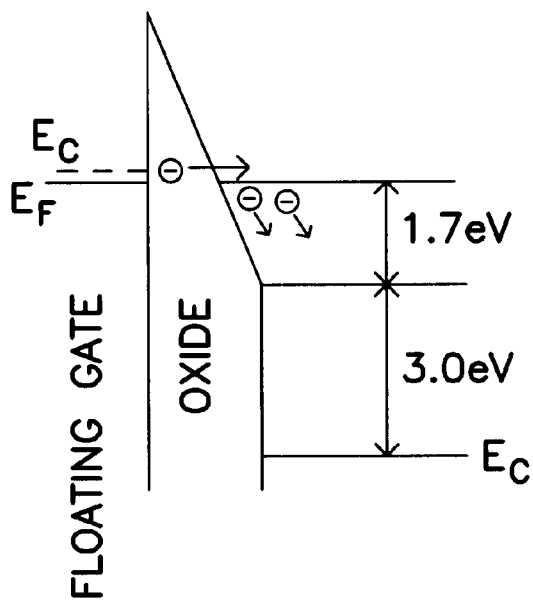
FIGS. 1A and 1B is are energy band diagram which illustrates generally F-N tunneling and Band to Band (BTB) tunneling of stored electrons off of and on to a floating gate according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The term conductor is understood to include semiconductors, and the term insulator is defined to include any material that is less electrically conductive than the materials referred to as conductors.

Enhancement mode means that if the transistors have a threshold voltage of some magnitude, VT, then the conduction is enhanced by applying a magnitude of the gate voltage, VGS, in excess of the threshold voltage to attract electrons or holes respectively to the channel and cause conduction between the source and drain. Depletion mode devices, on the other hand, are normally "on" and conduct with no applied gate voltage. The following detailed description is not to be taken in a limiting sense, and the scope of the present invention is defined only by the appended claims, along with the full scope of equivalents to which such claims are entitled.

Figure 2A:
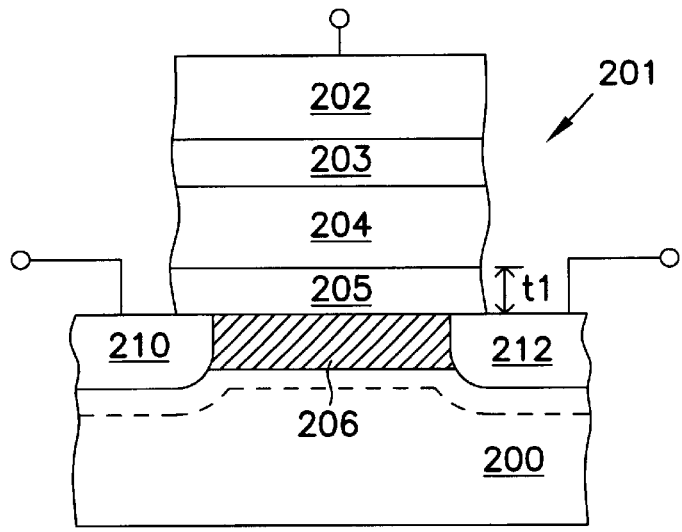
FIG. 2A illustrates a "static," non volatile, "depletion mode" p-channel floating gate transistor, or p-channel memory cell having a tunnel gate oxide of less than 50 Angstroms according to the teachings of the present invention.

FIG. 2A shows the basic structure of the static, non volatile memory cell, used in the present invention, which is similar to a flash memory device, except here the tunnel oxide is an ultrathin tunnel oxide and the conduction channel is implanted p-type to make a to depletion mode device, rather than the usual enhancement mode n-channel transistor. Thus, FIG. 2A illustrates a "static," non volatile, "depletion mode" p-channel floating gate transistor, or p-channel memory cell 201 having a tunnel gate oxide of less than 50 Angstroms according to the teachings of the present invention. The depletion mode p-channel flash memory cell 201 includes a depletion mode p-channel floating gate transistor. As shown in FIG. 2A, the depletion mode p-channel flash memory cell 201 of the present invention includes a control gate 202 and a floating gate 204 which can be driven at different potentials. The control gate 202 is separated from the floating gate 204 by an intergate dielectric layer, or intergate oxide 203. In one embodiment the intergate dielectric layer 203 includes a layer of silicon dioxide ($SiO_2$). In an alternative embodiment, the intergate dielectric layer 203 includes a silicon nitride layer ($Si_3N_4$) or any other suitable dielectric layer 203, the invention is not so limited.

FIG. 2A illustrates that the floating gate 204 is separated by an oxide layer, or tunnel gate oxide 205, from a channel region 206. The channel region 206 separates a source region 210 from a drain region 212 in a substrate 200. As one of ordinary skill in the art will understand upon reading this disclosure the source and drain regions, 210 and 212 respectively, include p-type doped source and drain regions, 210 and 212. The p-type doped source and drain regions, 210 and 212, can include heavily doped (p+) source and drain regions, 210 and 212. The substrate includes an n-type substrate or n-well 200.

According to the teachings of the present invention, the oxide layer 205 is an oxide layer which has a thickness (t1) of less than 50 Angstroms (Å). In one embodiment of the present invention, the oxide layer is approximately 30 Angstroms (Å). In one exemplary embodiment of the present invention, the oxide layer is approximately 23 Angstroms (Å). In one exemplary embodiment, the depletion mode p-channel flash memory cell 201 includes an n-type doped polysilicon floating gate 204 and an n-type doped control gate 202. The n-type doped polysilicon floating gate 204 and the n-type doped control gate 202 can include heavily doped (n+) polysilicon floating and control gates, 204 and 202 respectively. As shown in FIG. 2A, the depletion mode p-channel flash memory cell 201 of the present invention has an implanted p-type conduction channel 206 which is normally on or conducting with no applied gate voltage.

As disclosed in the co-filed, co-pending, commonly assigned U.S. patent application: entitled "Static NVRAM Ultra Thin Tunnel Oxides," attorney docket no. 303.680US1, Ser. No. 09/515,630, these device shown in FIG. 2A can be programmed with low voltages or gate oxide electric fields of 10 MV/cm, as for instance 2.3 Volts on 23 Å or 2.3 nm tunnel gate oxides, or 3.0 Volts on 30 Å or 3.0 nm tunnel gate oxides. Also, as disclosed in that application, the depletion mode p-channel flash memory cell 201 works on a different basis to achieve a non-volatile memory function. Normal flash memory devices with ultrathin tunnel oxides would be volatile or not maintain the memory charge state on the floating gate due to tunneling through the ultra thin gate oxide and charge leakage.

As described above, an exemplary embodiment of the depletion mode p-channel flash memory cell 201 normally might employ an n+polysilicon floating gate 204. However, for simplicity herein, the operation of the depletion mode p-channel flash memory cell's 201 will be described for the embodiment of a p+polysilicon floating gate 204. Either type of floating gate will work, and one of ordinary skill in the art will understand the comparable operation of the present invention for the embodiment of an n+polysilicon floating gate 204. The operation is simpler to describe with p+floating gate 204 because the work function difference between the floating gate 204 and p-type channel 206 and p+source regions 210 will be small. Work function differences just result in gate voltage offsets.

Figures 2B, 2C:
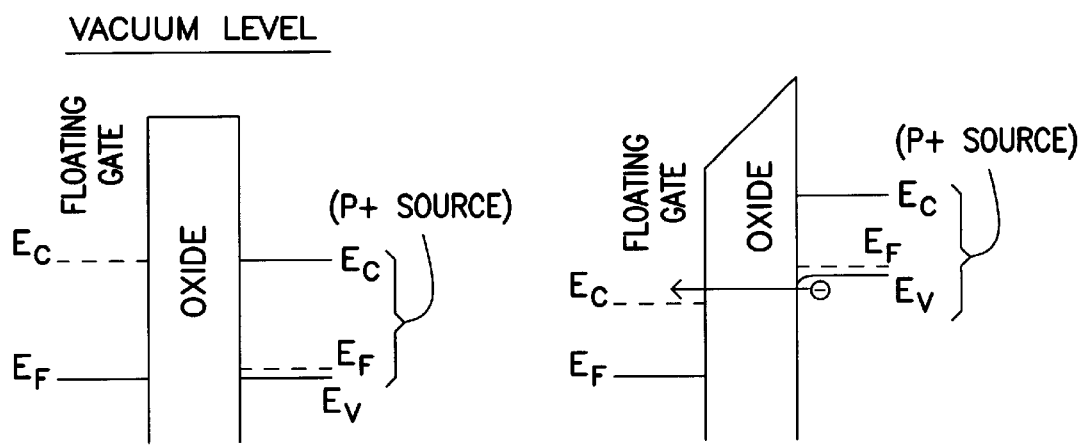
FIG. 2B shows the electron energy and band diagrams for the memory cell of FIG. 2A when the source and floating gate are both at zero or ground potential.
FIG. 2C is an energy band diagram which illustrates generally the write operation for the depletion mode, p-channel flash memory cell according to the teachings of the present invention.

FIG. 2B shows the electron energy and band diagrams for the memory cell of FIG. 2A when the source 210 and floating gate 204 are both at zero or ground potential. As shown in FIG. 2B, the Fermi levels for the source 210 and floating gate 204 are aligned.

FIG. 2C is an energy band diagram which illustrates generally the write operation for the depletion mode, p-channel flash memory cell according to the teachings of the present invention. As shown in FIG. 2C, a charge can be injected from the p+source region 210 to the floating gate by driving the control gate 204 to a large positive voltage which increases the potential of the floating gate, reduces electron energy, and causes valence band electrons in the p+source region 210 to tunnel on to the floating gate 204. The tunneling of charge to the floating gate can be achieved by FN tunneling, or by band to band, BTB, tunneling. The charge on the floating gate can be changed from a positive value to a neutral or even negative charge condition. The potential of the floating gate will decrease or the energy of electrons on the floating gate will increase. However, if not too many electrons are injected on to the floating gate, e.g. a charge of approximately $10^{-17}$ Coulombs, or approximately 100 electrons for a floating gate having a bottom surface area of approximately $10^{-10}$ cm$^2$ in the device of the present invention having an ultra thin tunnel gate oxide, they can not escape back to the silicon substrate since there are no available states in the silicon to which they can tunnel. When the control gate goes back to ground potential, or a negative potential, electrons will be trapped on the floating gate. These electrons cannot escape by tunneling to the substrate or source until the floating gate potential becomes about one voltage negative and the Fermi energy level in the floating gate aligns with the conduction band in the channel or the source region. In between these two potentials the band gap in the silicon substrate, or p+source region has no final electron states into which the electrons can tunnel.

Figure 2D:
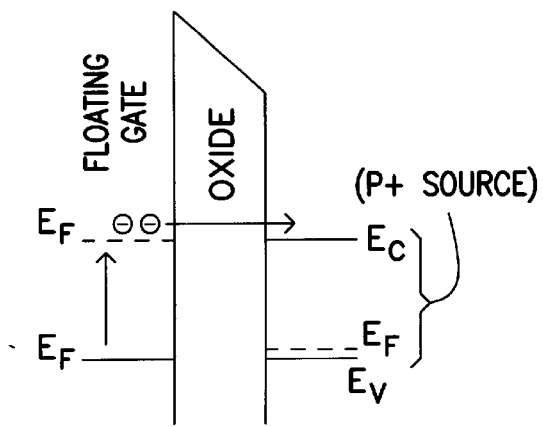
FIG. 2D is an energy band diagram which illustrates the point at which electrons can begin escaping from the floating gate of the memory cell of FIG. 2A by F-N tunneling back to the silicon substrate, or p+source region.

FIG. 2D is an energy band diagram which illustrates the point at which electrons can begin escaping from the floating gate 204 by F-N tunneling back to the silicon substrate, or p+source region 210. Once a sufficient negative potential is provided on the floating gate, the Fermi level in the floating gate 204 will be above the energy level of available final states in the substrate 206/200, or p+source region 210. As long as the floating gate potential does not go too far negative the electron charge will remain on the floating gate.

The erase operation (removing electrons from the floating gate 204) for the depletion mode, p-channel flash memory cell 201 is then performed by driving the control gate to a sufficiently large negative potential. The Fermi level in the floating gate 204 will then be above the energy level of available final states in the substrate 206/200, or p+source region 210. When the floating gate is driven to this sufficiently large negative potential the electrons can tunnel back to the silicon substrate 206/200, or p+source region 210, by FN tunneling or BTB tunneling. In this case there is a high density of available final states either in the oxide or silicon substrate/p+source region conduction bands.

Thus there is a range of floating gate potentials, of about 1 Volt, and floating gate charge where the depletion mode, p-channel flash memory cell 201 can have a fixed charge on the floating gate 204. These different fixed charge states will modulate the conductivity of the p-channel depletion mode transistor beneath the floating gate.

Figure 2E:
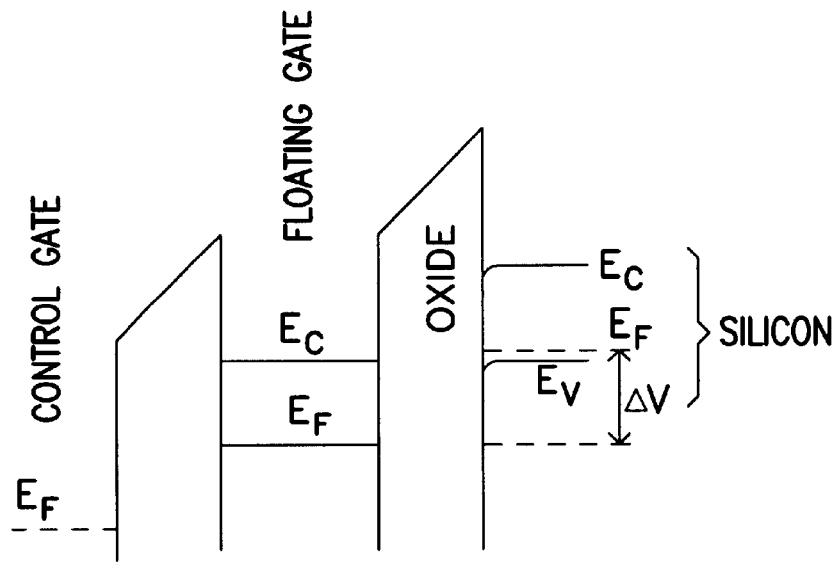
FIGS. 2E and 2F illustrate one embodiment of the operation of the depletion mode, p-channel flash memory cell of the present invention in a fixed charge state of no electrons stored on the floating gate.
Figure 2F:
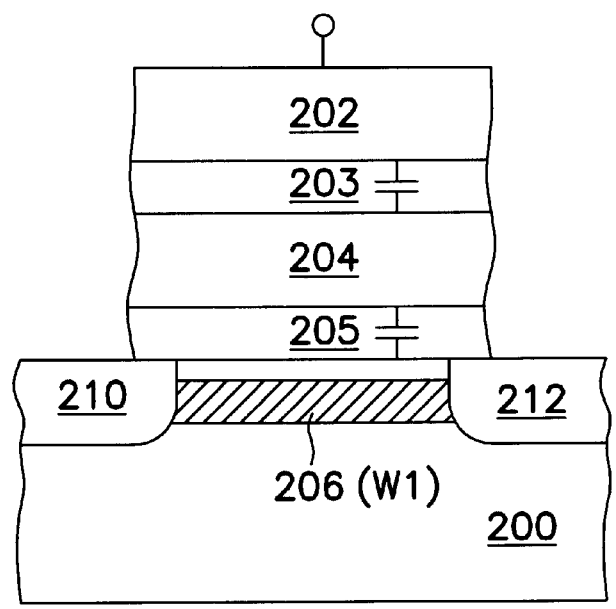

FIGS. 2E and 2F illustrate one embodiment of the operation of the depletion mode, p-channel flash memory cell 201 in a fixed charge state of no electrons stored on the floating gate. The normal operating voltage is with a floating gate potential of about 1.0 Volts or less positive. This floating gate potential is provided by biasing the control gate 202 at a positive voltage slightly in excess of plus 1.0 Volt. As shown in FIG. 2E, the floating gate potential is not driven far enough positive such that the conduction band (Ec) of the floating gate is below the valence band (Ev) of the silicon. Hence no electrons tunnel from the valance band of the silicon on to the floating gate 204.

As shown in FIG. 2F, this normal bias condition does serve to turn "off" the implanted depletion mode p-type channel 206. In other words, as shown in FIG. 2F, the width (W1) of the p-type conduction channel is narrowed.

Figure 2G:
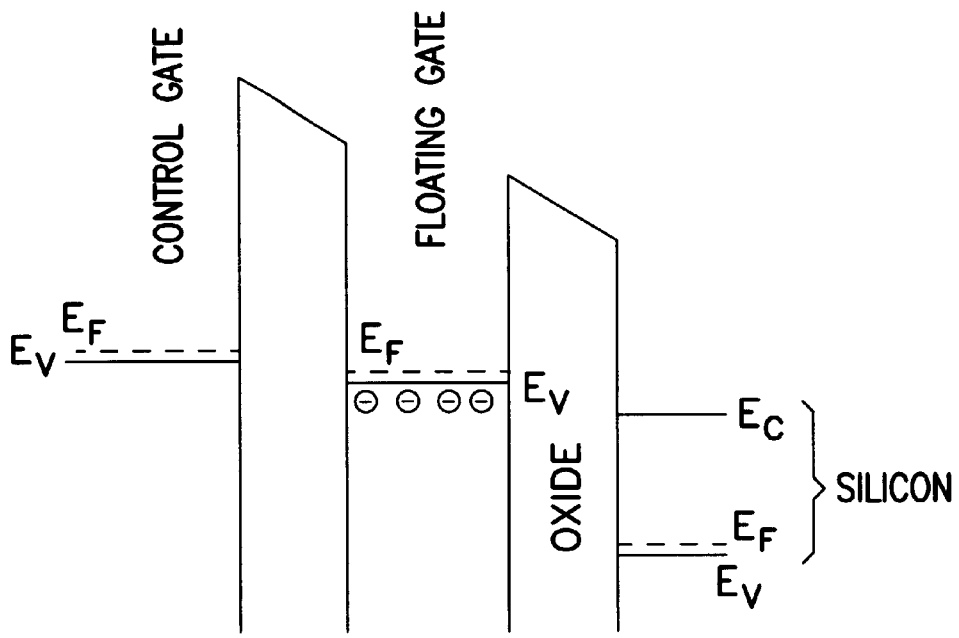
FIGS. 2G and 2H illustrate another embodiment of the operation of the depletion mode, p-channel flash memory cell of the present invention in a different fixed charge state where electrons are stored on the floating gate.
Figure 2H:
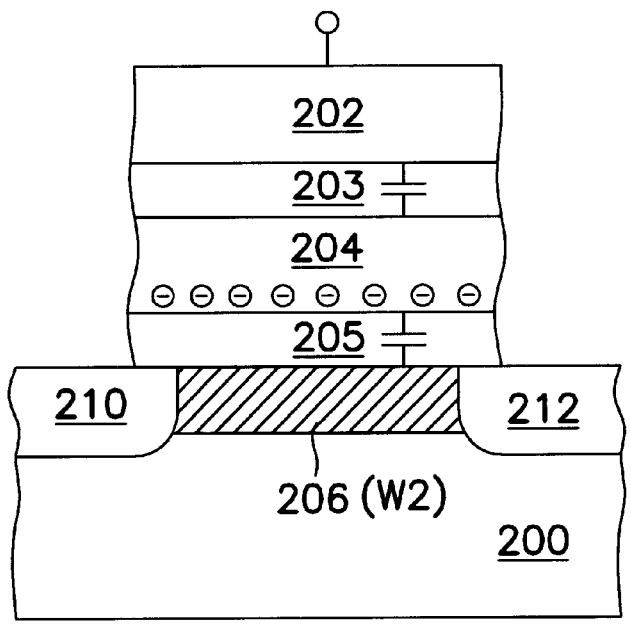

FIGS. 2G and 2H illustrate another embodiment of the operation of the depletion mode, p-channel flash memory cell 201 in a different fixed charge state where electrons are stored on the floating gate 204. According to the teachings of the present invention, if negative charge, electrons are stored on the floating gate 204, then the floating gate potential can be up to 1.0 Volts more negative before electrons can escape as shown in FIG. 2G. As shown in FIG. 2O, the floating gate potential is not driven far enough negative such that the valence band (Ev) of the floating gate is above the conduction band (Ec) of the silicon. Hence, the are no final states in the silicon for the electrons in the floating gate 204 to tunnel to and no electrons tunnel from the floating gate 204 to the silicon or p+source region 210.

As shown in FIG. 2H, a normal bias condition to the floating gate does not serve to turn "off" the implanted depletion mode p-type channel 206. In other words, as shown in FIG. 2H, the fixed charge state with electrons stored on the floating gate 204 maximizes the width (W2) of the p-type conduction channel. This negative charge on the floating gate 204 will result in a higher conductivity state of the p-type channel.

Thus, according to the teachings of the present invention, under normal operation the depletion mode, p-channel flash floating gate transistor 201 has two different conductivity states depending upon whether electrons are stored on the floating gate. These two different conductivity states includes a low DC conductivity state without stored charge and a higher conductivity state when electrons are stored on the floating gate 204. It is further noted here that the normal control gate operation is employing a positive voltage for programming. This positive voltage is opposite in polarity to the negative control gate voltages normally employed in PMOS circuits.

As mentioned above, n+polysilicon floating gates 204 can be more convenient to employ in practice since the depletion mode, p-channel flash floating gate transistors 201 will work while requiring less positive control gate voltages. The work function difference in using n+floating gates and n+control gates only results in an offset of gate voltages to more negative values.

Figure 1B:
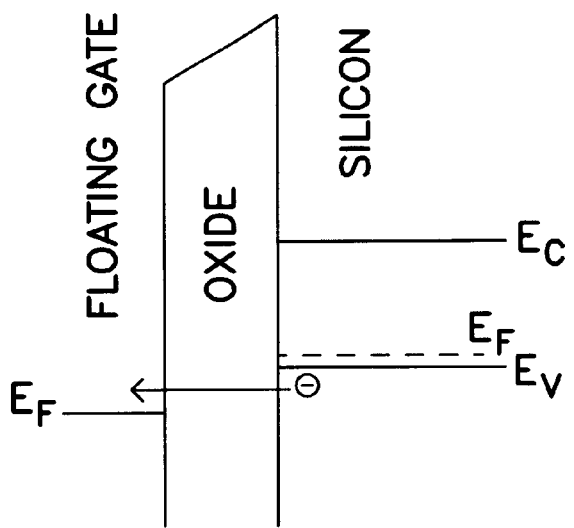
Figure 2I:
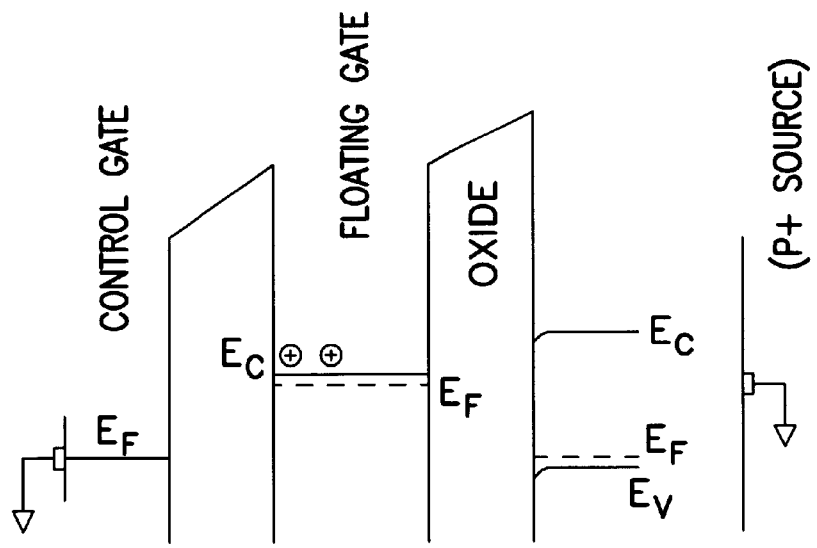
FIGS. 2I and 2J illustrate the equilibrium condition for the depletion mode, p-channel flash floating gate transistor of the present invention with an n+polysilicon floating gates after a long time has elapsed with the control gate and p+source region of the transistor grounded.
Figure 2J:
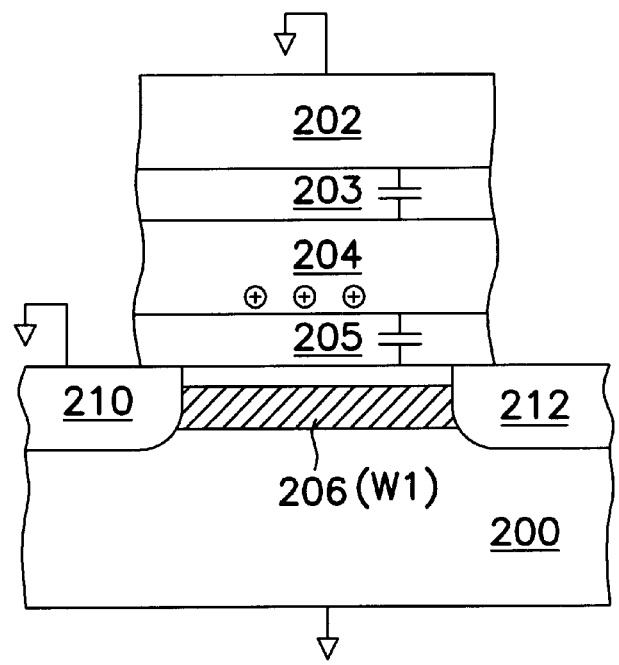

FIGS. 2I and 2J illustrate the equilibrium condition for the depletion mode, p-channel flash floating gate transistor 201 with an n+polysilicon floating gates 204 after a long time has elapsed with the control gate 202 and p+source region 210 of the transistor grounded. FIG. 2I is an energy band diagram which illustrates generally the relative valence, conduction, and Fermi energy band levels of the device in an equilibrium condition if the control gate 202 were grounded and after a theoretical infinite amount of time has elapsed. If the control gate 202 is grounded and the source region 210 is grounded then the Fermi level in the control gate 204 and the source region 210 must line up or be at the same potential. The work functions of the n+poly gates, 202 and 204, and the work function of the p+silicon source region, 210, are quite different. If the n+poly control gate 202 is grounded this tends to pull the bands down to a lower energy state, in the same sense that the work function difference in an NMOS transistor on a p-type substrate tends to invert the substrate and try to collect electrons at the silicon surface. If temperatures are high enough and/or enough time has elapsed, this may be a very long time, then the structure must come to thermal equilibrium where the Fermi levels in the control gate and the p+source region line up and the structure satisfies the electrostatic constraints to be charge neutral. This solution is shown in FIG. 1B where some electrons have escaped from the floating gate 204 and the floating gate 204 has a small positive charge. This solution satisfies all electrostatic and potential considerations and constraints.

Because of the work function difference, the floating gate 204 will equilibrate to a slightly negative potential with a small residual stored charge and the depletion mode, p-channel flash floating gate transistor 201 will be in a low conductivity state, e.g. p-type conduction channel 206 width (W1), as shown in FIG. 2J. If the control gate 202 is stepped negative, the depletion mode, p-channel flash floating gate transistor 201 will turn on to a higher conductivity state, e.g. p-type conduction channel 206 width greater than W1.

Figure 2K:
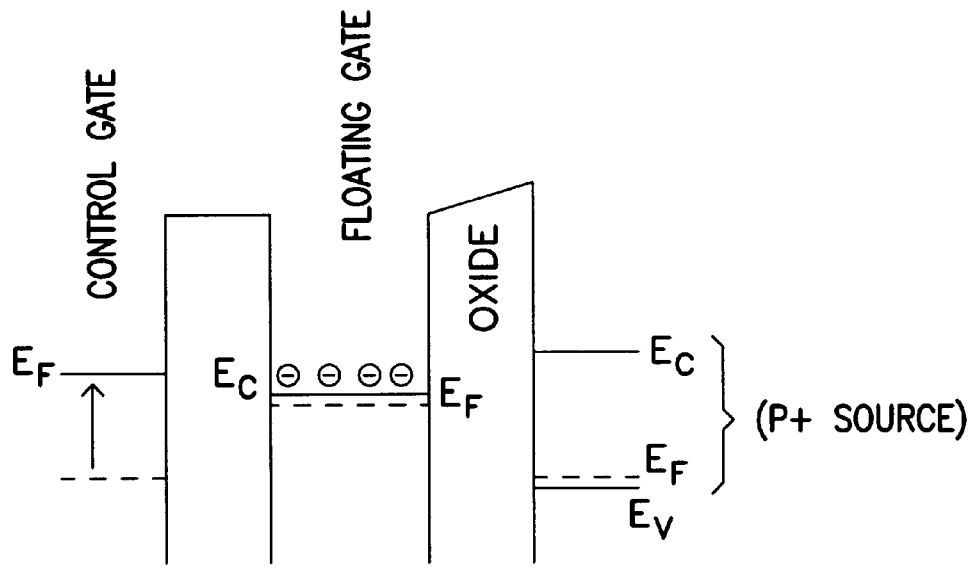
FIGS. 2K and 2L illustrate the device of FIGS. 2I and 2J with a negative charge is stored on the floating gate such that the conductivity of the depletion mode, p-channel flash floating gate transistor is much higher.
Figure 2L:
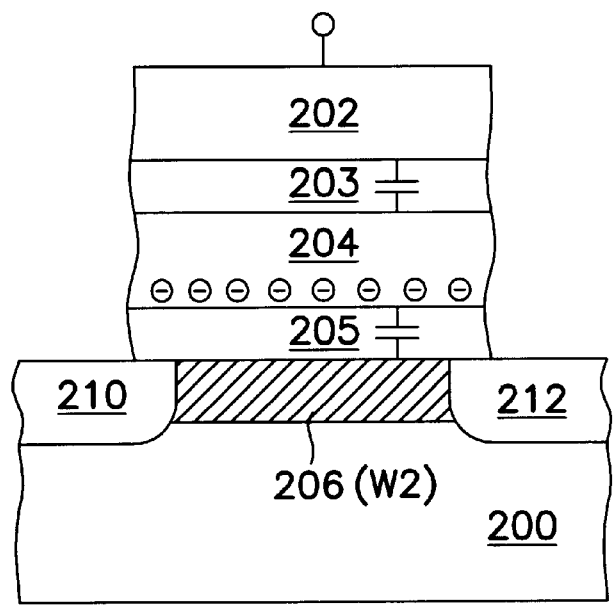

However, as shown in FIGS. 2K and 2L for the same device, if a negative charge is stored on the floating gate 204 then the conductivity of the depletion mode, p-channel flash floating gate transistor 201 will be much higher, e.g. p-type conduction channel 206 width (W2). Hence, the conductivity state of the depletion mode, p-channel flash floating gate transistor 201 of the present invention can be determined with zero volts on the control gate. In the fixed charge state without a stored charge on the floating gate the conductivity will be low. In the fixed charge state with a stored charge of electrons on the floating gate the conductivity will be much higher.

In the co-filed, co-pending, commonly assigned U.S. patent application: entitled "Static NVRAM Ultra Thin Tunnel Oxides," attorney docket no. 303.680US1, Ser. No. 09/515,630, the manner in which the individual depletion mode, p-channel flash floating gate transistors 201 of the present invention can be selectively programmed was disclosed. One of ordinary skill in the art will understand upon reading this disclosure, the manner in which the same can be selectively programmed within the programmable logic array (PLA) of the present invention. In the same application, it was described that in a read operation sense time of 1.0 nanosecond, $t_{sense}=1$ ns, that a difference in signal of approximately 100 mV is placed on the drain line, or output line coupled to the drain region 212.

Also, in co-pending, commonly assigned U.S. patent applications: entitled, "Dynamic Flash Memory Cells with Ultra Thin Tunnel Oxides," attorney docket no. 303.682US1, Ser. No. 09/513,938, and entitled, "P-Channel Dynamic Flash Memory Cells with UltraThin Tunnel Oxides," attorney docket no. 303.684US1, Ser. No. 09/514,627, each of which disclosure is herein incorporated by reference, it was shown that if ultra thin tunnel gate oxides are used then the write, erase, and read operations will be relatively fast as compared with conventional DRAM technology. That is a write and erase time of approximately 200 nanoseconds, if a 2.3 nm or 23 Å gate oxide is used with a voltage of 2.3 Volts, producing an electric field of 10.0 MV/cm. The current density produced is large, approximately 0.5 A/cm$^2$.

Further, in co-pending, commonly assigned U.S. patent applications: entitled, "Dynamic Flash Memory Cells with UltraThin Tunnel Oxides," attorney docket no. 303.682US1, Ser. No. 09/513,938, and entitled, "P-Channel Dynamic Flash Memory Cells with UltraThin Tunnel Oxides," attorney docket no. 303.684US1, Ser. No. 09/514,627, each of which disclosure is herein incorporated by reference, it was further shown that some very long mean times to failure have been reported on ultrathin tunnel oxides. For example, with an electric field in the gate oxide of 10 MV/cm, as disclosed by G. Lucovsky et al., *IEEE Electron Device Letters*, vol. 20: no. 6, pp. 262–264 (1999), these include up to 19 years with 23 Å or 2.3 nm oxides. There is good reason to believe in the case of FN tunneling that there is a minimum potential or energy of around 4.7 V which is required to cause damage in a tunnel gate oxide, 3.0 eV to overcome the silicon-oxide barrier and 1.7 eV required for acceleration of the electrons in the conduction band of the oxide, as disclosed by G. Lucovsky et al., *IEEE Electron Device Letters*, vol. 20: no. 6, pp. 262–264 (1999); and N. Patel et al., *Appl. Phys. Lett.*, vol. 64: no. 14, 1809–11 (1994). This was illustrated in FIG. 1A. In the case of band to band tunneling, BTB, this is a quantum mechanical effect and no direct collisions occur between electrons and atoms in the oxide so again there would be no damage in the oxide. BTB tunneling as applied in these devices is illustrated in FIG. 1B. Recent investigations, as disclosed by D. A. Muller et al. "The electronic structure at the atomic scale of ultrathin gate oxides," Nature, vol. 399, pp. 758–761, Jun. 24, 1999, suggest that gate oxides as thin as 12 Å or 1.2 nm may eventually be used in CMOS devices. Thus, there may be good scientific basis to believe that ultrathin tunnel gate oxides may in fact be much more reliable than the current 100 Å or 10 nm gate oxides used in flash memory devices.

Figure 3A:
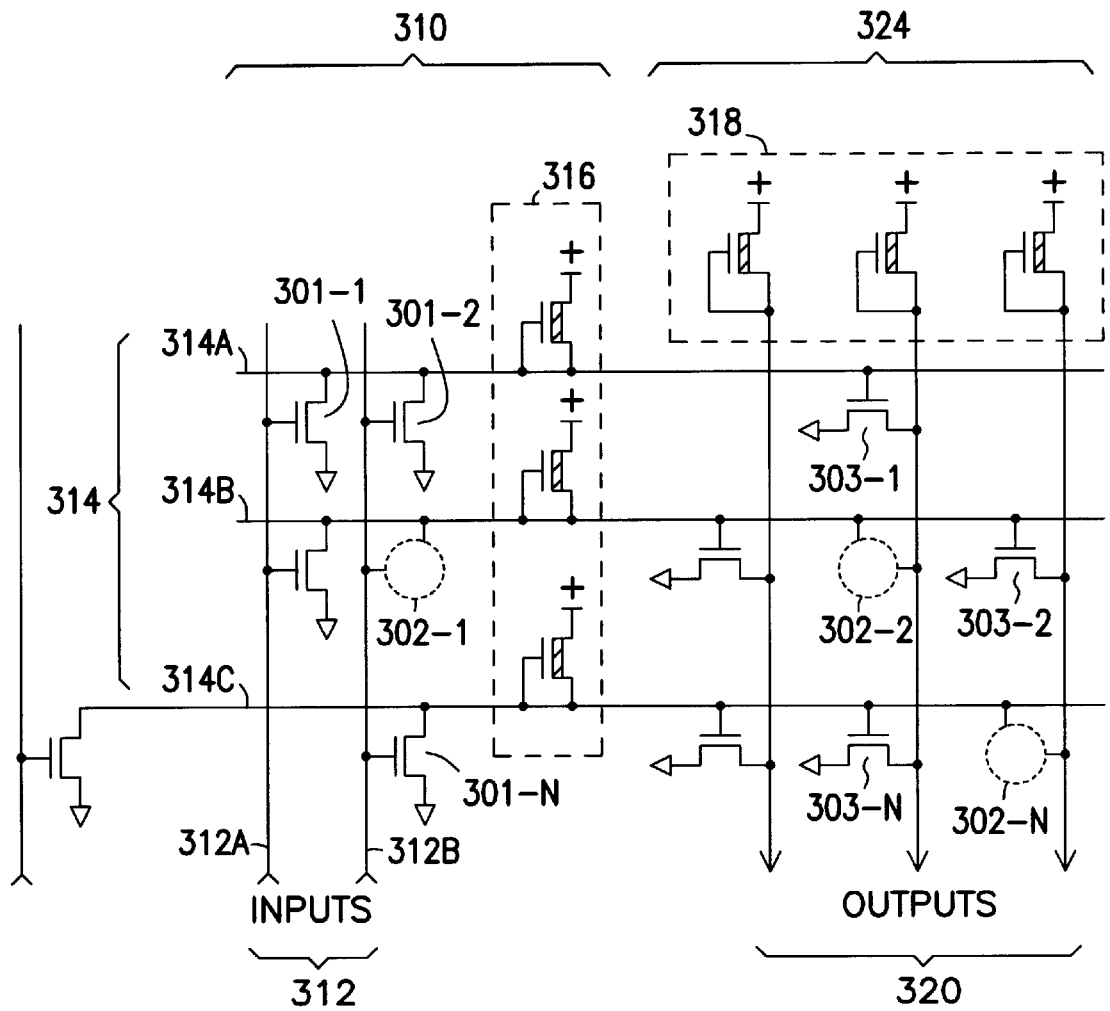
FIG. 3A is a schematic diagram illustrating a conventional NOR-NOR programmable logic array.

FIG. 3A shows a simple NOR-NOR logic array 300 which is programmable at the gate mask level by either fabricating a thin oxide gate transistor, e.g. transistors 301-1, 301-2, . . . , 301-N and 303-1, 303-2, . . . , 303-N, at the intersection of lines in the array or not fabricating a thin oxide gate transistor, e.g. missing thin oxide transistors, 302-1, 302-2, . . . , 302-N, at such an intersection. As one of ordinary skill in the art will understand upon reading this disclosure, the same technique is conventionally used to form other types of logic arrays not shown. As shown in FIG. 3A, a number of depletion mode NMOS transistors, 316 and 318 respectively, are used as load devices.

The conventional logic array shown in FIG. 3A includes a first logic plane 310 which receives a number of input signals at input lines 312. In this example, no inverters are provided for generating complements of the input signals. However, first logic plane 310 can include inverters to produce the complementary signals when needed in a specific application.

First logic plane 310 includes a number of thin oxide gate transistor, e.g. transistors 301-1, 301-2, . . . , 301-N. The thin oxide gate transistor, e.g. transistors 301-1, 301-2, . . . , 301-N, are located at the intersection of input lines 312, and interconnect lines 314. In the conventional PLA of FIG. 3A, this selective fabrication of thin oxide gate transistor, e.g. transistors 301-1, 301-2, . . . , 301-N, is referred to as programming since the logical function implemented by the programmable logic array is entered into the array by the selective arrangement of the thin oxide gate transistor, e.g. transistors 301-1, 301-2, . . . , 301-N, at the intersections of input lines 312, and interconnect lines 314 in the array.

In this embodiment, each of the interconnect lines 314 acts as a NOR gate for the input lines 312 that are connected to the interconnect lines 314 through the thin oxide gate transistor, e.g. transistors 301-1, 301-2, . . . , 301-N, of the array. For example, interconnection line 314A acts as a NOR gate for the signals on input lines 312A and 312B. That is, interconnect line 314A is maintained at a high potential unless one or more of the thin oxide gate transistor, e.g. transistors 301-1, 301-2, . . . , 301-N, that are coupled to interconnect line 314A are turned on by a high logic level signal on one of the input lines 312. When a control gate address is activated, through input lines 312, each thin oxide gate transistor, e.g. transistors 301-1, 301-2, . . . , 301-N, conducts which performs the NOR positive logic circuit function, an inversion of the OR circuit function results from inversion of data onto the interconnect lines 314 through the thin oxide gate transistor, e.g. transistors 301-1, 301-2, . . . , 301-N, of the array.

As shown in FIG. 3A, a second logic plane 324 is provided which includes a number of thin oxide gate transistor, e.g. transistors 303-1, 303-2, . . . , 303-N. The thin oxide gate transistor, e.g. transistors 303-1, 303-2, . . . , 303-N, are located at the intersection of interconnect lines 314, and output lines 320. Here again, the logical function of the second logic plane 324 is implemented by the selective arrangement of the thin oxide gate transistor, e.g. transistors 303-1, 303-2, . . . , 303-N, at the intersections of interconnect lines 314, and output lines 320 in the second logic plane. The second logic plane 324 is also configured such that the output lines 320 comprise a logical NOR function of the signals from the interconnection lines 314 that are coupled to particular output lines 320 through the thin oxide gate transistor, e.g. transistors 303-1, 303-2, . . . , 303-N, of the second logic plane 324. Thus, in FIG. 3A, the incoming signals on each line are used to drive the gates of transistors in the NOR logic array as the same is known by one of ordinary skill in the art and will be understood by reading this disclosure.

Figure 3B:
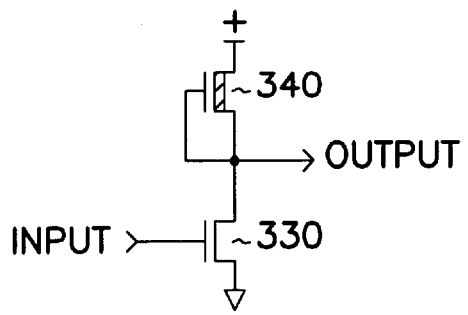
FIG. 3B, illustrates in more detail that the transistors used in FIG. 3A are enhancement mode NMOS transistors with a depletion mode NMOS load technology according to the teachings of the prior art.

As shown in FIG. 3B, the transistors used in FIG. 3A are NMOS transistors 330 with a depletion mode NMOS load technology 340. The load device or NMOS load transistor 340 is a depletion mode or normally "on" transistor which is saturated during the pull up switching transient thus providing high switching speed. The driver transistor 330 is an enhancement mode NMOS transistor 330 which is normally "off" with zero gate bias. All voltages are positive in a simple NMOS circuit.

Figure 4C:
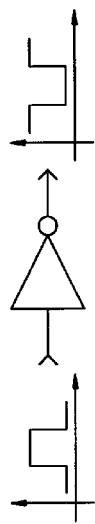
FIGS. 4A–4C illustrate a static logic depletion load inverter 400, according to the teachings of the present invention, with a depletion mode p-channel floating gate load transistor and a depletion mode p-channel floating gate driver transistor in a negative logic system.
Figure 4B:
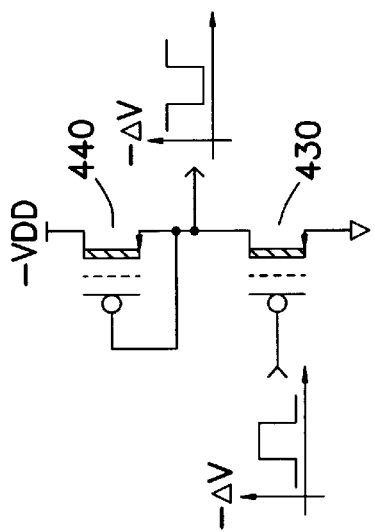
Figure 4A:
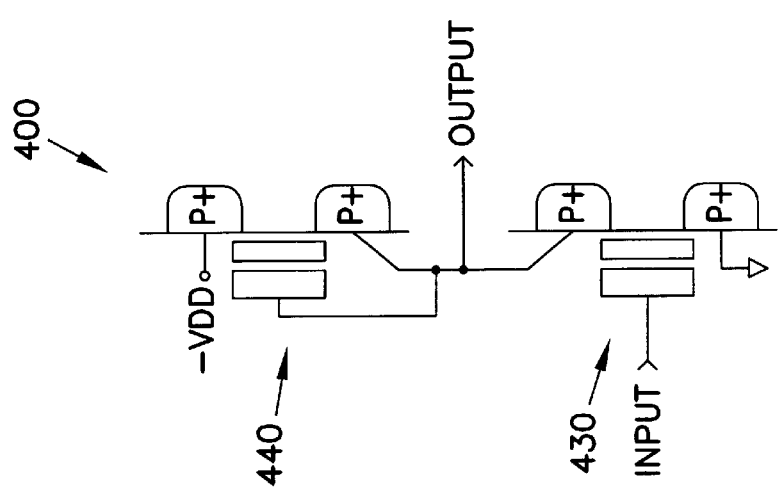

In the PLA of the present invention, the transistors in the PLA array are depletion mode p-channel floating gate transistors, as described above in connection with FIG. 2, and not enhancement mode n-channel transistors as is more usual. FIGS. 4A–4C describes the operation of p-channel enhancement/depletion mode or depletion mode load technology, which is most conveniently implemented in a negative logic system rather than the more common positive logic system. In a negative logic system the "one" logic state is the most negative voltage and "zero" the most positive voltage. FIGS. 4A–4C then shows a static logic depletion load inverter 400, according to the teachings of the present invention, with depletion mode p-channel floating gate load driver transistor 430 and depletion mode p-channel floating gate driver transistor 440 in a negative logic system.

As explained in connection with FIG. 2, with zero volts gate to source voltage (VGS), and no stored charge on the depletion mode p-channel floating gate load transistor 440, the conductivity of the depletion mode p-channel floating gate load transistor 440 is in a low state. This depletion mode p-channel floating gate load transistor 440 can be used as normal depletion mode load devices 440 since it will saturate at a low drain voltage and provide nearly ideal depletion mode load transistor characteristics.

Similarly as explained in connection with FIG. 2, with zero volts on the control gate, and no stored charge on the floating gate of the depletion mode p-channel floating gate driver transistor 430, the driver transistor 430 is in a low conductivity state. In operation, according to the present invention, when the input gate voltage of the depletion mode p-channel floating gate driver transistor 430 steps more negative there are two possibilities. First, if there is no stored charge on the floating gate of the depletion mode p-channel floating gate driver transistor 430, the conductivity will remain in a low state. However, if there is a stored charge of electrons on the floating gate of the depletion mode p-channel floating gate driver transistor 430, then the conductivity will be a high state, increasing the conduction of the output to ground such that the output will become less negative or inverted in a negative logic system.

In summary, the depletion load circuit 400 of the present invention can be designed to have two different output states by appropriately selecting the size, or W/L ratios of the driver 430 (W/L)d and depletion mode load 440 (W/L)1 devices as is normally done in ratioed static inverter and logic circuits. If electrons are stored on the floating gate of the depletion mode p-channel floating gate driver transistor 430, then when the input steps more negative the conductivity of the driver transistor will be high and the output become less negative or inverted in a negative logic system. On the other hand, if there is no stored charge on the floating gate of the depletion mode p-channel floating gate driver transistor 430, then the conductivity of the driver will remain low and the output will not change states. In this manner the driver transistors 430 can be programmed, if they have a negative charge stored on the floating gate they will function as normal inverters as shown in FIG. 4C. If there is no stored charge on the floating gate, the conductivity of the driver transistors 430 will not become high enough and they will not function as driver transistors. In this later case, the output of the depletion load circuit 400 of the present invention will not change charge states. Thus, if there is no charge stored on the floating gate of the depletion mode p-channel floating gate driver transistors 430, the drivers are effectively removed from the logic circuits.

Figure 5:
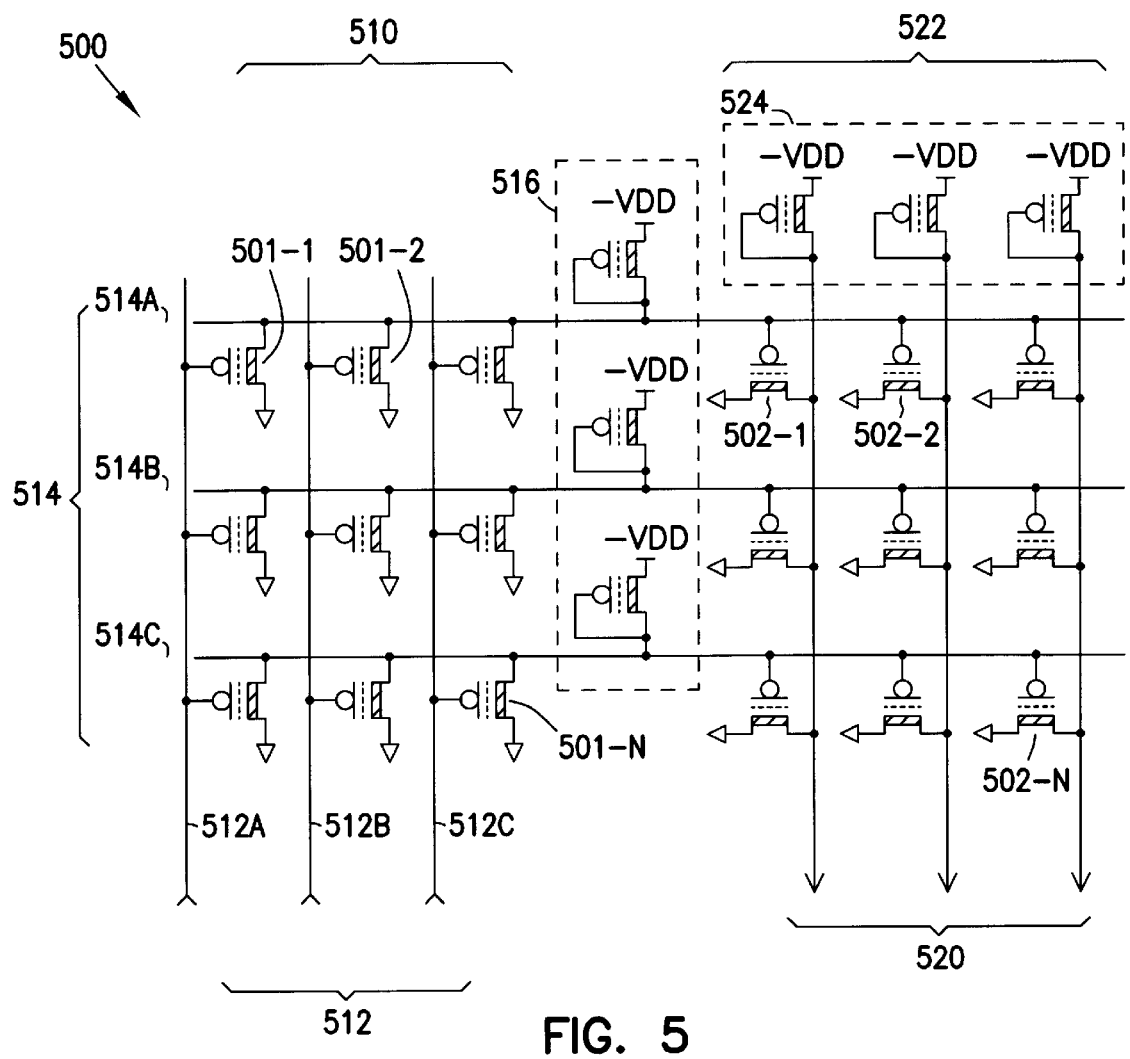
FIG. 5 is a schematic diagram illustrating generally an architecture of one embodiment of a programmable logic array (PLA) using a negative logic system according to the teachings of the present invention.

FIG. 5 is a schematic diagram illustrating generally an architecture of one embodiment of a programmable logic array (PLA) 500 using a negative logic system according to the teachings of the present invention. PLA 500 implements an illustrative logical function using a two level logic approach. Specifically, PLA 500 includes first and second logic planes 510 and 522. In this example, the logic function is implemented using NOR-NOR logic. As shown in FIG. 5, first and second logic planes 510 and 522 each include an array of depletion mode p-channel floating gate driver transistors, 501-1, 501-2, . . . , 501-N, and 502-1, 502-2, . . . , 502-N respectively, having their source regions coupled to ground, as presented and described in detail in connection to FIG. 2, that are configured to implement the logical function of PLA 500. Also, as shown in FIG. 5A, a number of depletion mode p-channel floating gate load transistors, 516 and 524 respectively, having their drain regions coupled to a negative voltage potential (−VDD) are used as load devices in complement to the depletion mode p-channel floating gate driver transistors, 501-1, 501-2, . . . , 501-N, and 502-1, 502-2, . . . , 502-N to form depletion load inverters, as described in detail in FIG. 4.

It is noted that the configuration of FIG. 5 is provided by way of example and not by way of limitation. Specifically, the teachings of the present application are not limited to programmable logic arrays in the NOR-NOR approach. Further, the teachings of the present application are not limited to the specific logical function shown in FIG. 5. Other logical functions can be implemented in a programmable logic array, with the depletion mode p-channel floating gate driver transistors, 501-1, 501-2, . . . , 501-N, and 502-1, 502-2, . . . , 502-N the depletion mode p-channel floating gate load transistors, 516 and 524 respectively, of the present invention, using any one of the various two level logic approaches.

First logic plane 510 receives a number of input signals at input lines 512. In this example, no inverters are provided for generating complements of the input signals. However, first logic plane 510 can include inverters to produce the complementary signals when needed in a specific application.

First logic plane 510 includes a number of depletion mode p-channel floating gate driver transistors, 501-1, 501-2, . . . , 501-N, that form an array. The depletion mode p-channel floating gate driver transistors, 501-1, 501-2, . . . , 501-N are located at the intersection of input lines 512, and interconnect lines 514. Not all of the depletion mode p-channel floating gate driver transistors, 501-1, 501-2, . . . , 501-N are operatively conductive in the first logic plane. Rather, the depletion mode p-channel floating gate driver transistors, 501-1, 501-2, . . . , 501-N are selectively programmed, as described in detail in FIGS. 2 and 4, to respond to the input lines 512 and change the potential of the interconnect lines 514 so as to implement a desired logic function. Thus, some depletion mode p-channel floating gate driver transistors, 501-1, 501-2, . . . , 501-N are left unprogrammed as described in FIGS. 2 and 4. This selective interconnection is referred to as programming since the logical function implemented by the programmable logic array is entered into the array by the depletion mode p-channel floating gate driver transistors, 501-1, 501-2, . . . , 501-N that are used at the intersections of input lines 512, and interconnect lines 514 in the array.

In this embodiment, each of the interconnect lines 514 acts as a NOR gate for the input lines 512 that are connected to the interconnect lines 514 through the depletion mode p-channel floating gate driver transistors, 501-1, 501-2, . . . , 501-N of the array 500. For example, interconnection line 514A acts as a NOR gate for the signals on input lines 512A, 512B and 512C. That is, interconnect line 514A is maintained at a negative potential unless one or more of the depletion mode p-channel floating gate driver transistors, 501-1, 501-2, . . . , 501-N that are coupled to interconnect line 514A are turned on by a negative voltage step signal on one of the input lines 512. When a control gate address is activated, through input lines 512, each depletion mode p-channel floating gate driver transistors, 501-1, 501-2, . . . , 501-N either conducts or does not conduct depending on the charge stored upon its floating gate, as explained in detail in connection with FIGS. 2 and 4. This performs the NOR negative logic circuit function, an inversion of the OR circuit function results from inversion of data onto the interconnect lines 514 through the depletion mode p-channel floating gate driver transistors, 501-1, 501-2, . . . , 501-N of the array 500. In this manner a NOR-NOR electrically programmable logic array is most easily implemented utilizing the normal PLA array structure.

In a similar manner, second logic plane 522 comprises a second array of depletion mode p-channel floating gate driver transistors, 502-1, 502-2, . . . , 502-N that are selectively programmed to provide the second level of the two level logic needed to implement a specific logical function. In this embodiment, the array of depletion mode p-channel floating gate driver transistors, 502-1, 502-2, . . . , 502-N is also configured such that the output lines 520 comprise a logical NOR function of the signals from the interconnection lines 514 that are coupled to particular output lines through the depletion mode p-channel floating gate driver transistors, 502-1, 502-2, . . . , 502-N of the second logic plane 522.

Thus FIG. 5 shows the application of the programmable depletion mode p-channel floating gate transistors in a logic array. If a depletion mode p-channel floating gate driver transistors, 501-1, 501-2, . . . , 501-N, and 502-1, 502-2, . . . ,

502-N, is programmed with a negative charge on the floating gate it will be active in the array, if not it is effectively removed from the array. In this manner the array logic functions can be programmed even when the circuit is in the final circuit or in the field and being used in a system.

Figure 6:
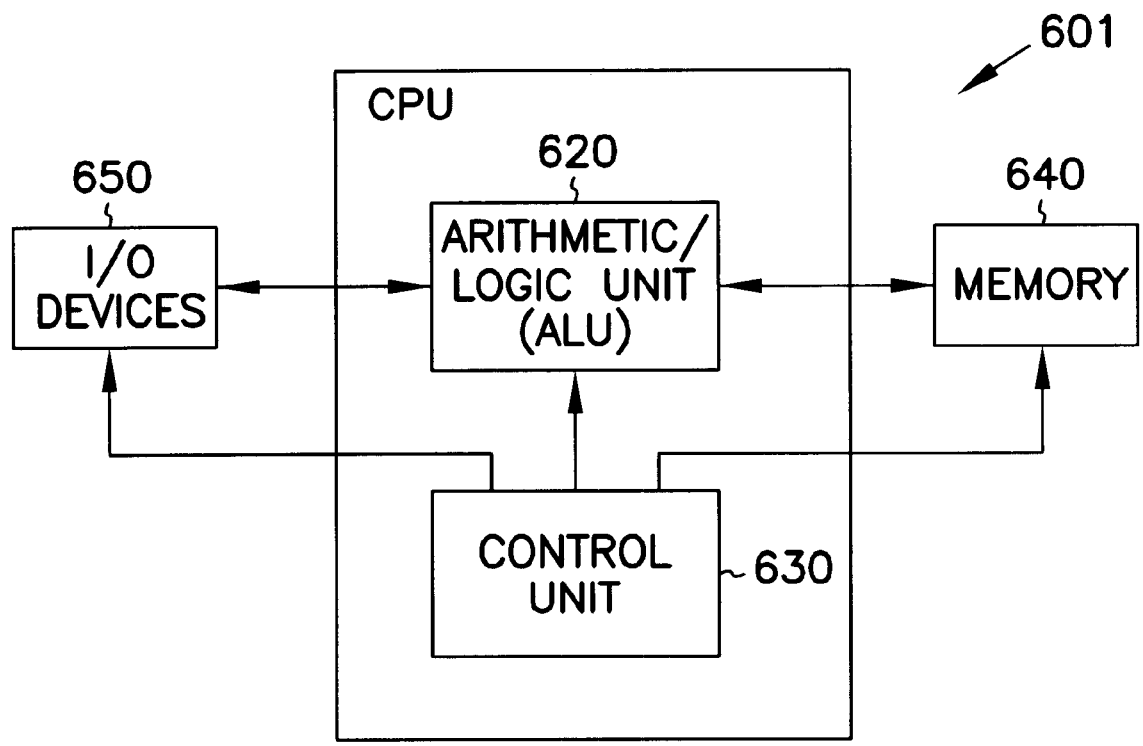
FIG. 6 is a simplified block diagram of a high-level organization of an electronic system according to the teachings of the present invention.

FIG. 6 is a simplified block diagram of a high-level organization of an electronic system 600 according to the teachings of the present invention. As shown in FIG. 6, the electronic system 600 is a system whose functional elements consist of an arithmetic/logic unit (ALU) 620, a control unit 630, a memory unit 640 and an input/output (I/O) device 650. Generally such an electronic system 600 will have a native set of instructions that specify operations to be performed on data by the ALU 620 and other interactions between the ALU 620, the memory unit 640 and the I/O devices 650. The memory units 640 contain the data plus a stored list of instructions.

The control unit 630 coordinates all operations of the ALU 620, the memory unit 640 and the I/O devices 650 by continuously cycling through a set of operations that cause instructions to be fetched from the memory unit 640 and executed. Field programmable logic arrays, according to the teachings of the present invention, can be implemented to perform many of the logic functions performed by these components. With respect to the ALU 620, the control unit 630 and the I/O devices 650, arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND.

The Figures presented and described in detail above are similarly useful in describing the methods of the present invention. That is one embodiment of the present invention includes a method for forming a programmable logic array. The method includes forming a first logic plane that receives a number of input signals. Forming the first logic plane includes forming a plurality of non-volatile memory cells arranged in rows and columns that are interconnected to provide a number of logical outputs. The method further includes forming a second logic plane having a number of non-volatile memory cells arranged in rows and columns that receive the outputs of the first logic plane and that are interconnected to produce a number of logical outputs such that the programmable logic array implements a logical function. According to this method, forming the non-volatile memory cells includes forming depletion mode p-channel memory cells. Forming the depletion mode p-channel memory cells further includes forming a control gate, forming a floating gate separated from the control gate by a dielectric layer, and forming an oxide layer of less than 50 Angstroms (Å) which separates the floating gate from a p-type doped channel region separating a source and a drain region in a substrate.

According to the teachings of the present invention, forming the floating gate includes forming the floating gate to have a limited range of floating gate potentials or electron energies for which electrons can neither tunnel to the channel region or the source region nor electrons tunnel from the channel region or the source region to the floating gate. As explained above, when the floating gate is programmed with a minimal or no fixed charge on the floating gate over the limited range of floating gate potentials or electron energies, the depletion mode p-channel memory cells is effectively removed from the array. Conversely, when the floating gate is programmed with a fixed charge on the floating gate over the limited range of floating gate potentials or electron energies, the depletion mode p-channel memory cells is effectively included in the array. In one embodiment, forming the first logic plane and the second logic plane each comprise forming NOR planes. Forming each control gate in the first logic plane includes forming the control gate to interconnect with one of the input lines. Forming each control gate in the second logic plane includes forming the control gate to interconnect with one of the source and drain regions in the first logic plane. In one embodiment, the method includes forming an n+type, heavily doped, polysilicon floating gate.

Another embodiment of the present invention includes a method for operating a programmable logic array having a number of non volatile depletion mode, floating gate, p-channel memory cells with ultra thin gate oxides. This embodiment includes selectively storing a limited charge on at least one of the floating gates for the number of non volatile depletion mode, floating gate, p-channel memory cells. In this embodiment, selectively storing the limited charge on the at least one of the floating gates controls an electrical conduction between a source and a drain region for that non volatile depletion mode, floating gate, p-channel memory cell. The method further includes applying a limited range of floating gate potentials to the number of non volatile depletion mode, floating gate, p-channel memory cells in the array.

According to the teachings of the present invention, selectively storing a limited charge on at least one of the floating gates for the number of non volatile depletion mode, floating gate, p-channel memory cells includes applying a potential of less than 3.0 volts across the gate oxide for that memory cell. Applying a potential of less than 3.0 volts across the gate oxide for that memory cell includes applying the potential for less than 200 nanoseconds.

In one embodiment, the method further includes selectively removing a limited charge on at least one of the floating gates for the number of non volatile depletion mode, floating gate, p-channel memory cells, wherein selectively removing the limited charge on the at least one of the floating gates effectively removes that non volatile depletion mode, floating gate, p-channel memory cell from the array. Selectively removing a limited charge on at least one of the floating gates for the number of non volatile depletion mode, floating gate, p-channel memory cells includes applying a potential of less than 3.0 volts across the gate oxide for that memory cell. Applying a potential of less than 3.0 volts across the gate oxide for that memory cell includes applying the potential for less than 200 nanoseconds.

According to the teachings of the present invention, applying a limited range of floating gate potentials to the number of non volatile depletion mode, floating gate, p-channel memory cells to.

The programmable transistors with ultra thin gate oxides will normally work with voltages around one Volt, they can be programmed with voltages in the range 2 to 3 Volts. This allows the fabrication of low voltage programmable memory address decode circuits which operate with low voltage power supplies which will be used with CMOS technology which has feature sizes of the order 0.1 $\mu$m, 1000 A, or 100 nm. operate the PLA includes applying a limited range of floating gate potentials of approximately +/−1.0 Volts. Applying a limited range of floating gate potentials of approximately +/−1.0 Volts includes applying the limited range of floating gate potentials of approximately +/−1.0 Volts for approximately 1.0 nanoseconds.

CONCLUSION

Thus, systems and methods for programmable logic arrays with ultra thin tunnel oxides are have been shown.

The field programmable, in service or in circuit programmable, logic devices of the present invention work with much lower voltages than the normal flash memory type devices used in current PLA technology. They can be programmed with voltages of 2.0 to 3.0 Volts and the normal operating voltages on the control gates are of the order 1.0 Volts. The low programming voltage is a consequence of the ultra thin tunnel oxides.

The devices are not similar to normal flash memory devices but rather employ a unique device structure and operating conditions to achieve a nonvolatile memory function. There is a range of floating gate potentials over which charge can not leak off of the floating gate since there are no final states to which the electrons can tunnel to in the silicon substrate. In this manner ultrathin gate oxides can be used as to provide a nonvolatile memory function and the transistor in the logic array can be programmed to perform different logic functions. Further, the PLA's of the present invention are well suited to scale with the shrinking design rules of integrated circuit technology.

What is claimed is:

1. A programmable logic array, comprising:
    a first logic plane that receives a number of input signals, the first logic plane having a plurality of non-volatile memory cells arranged in rows and columns that are interconnected to provide a number of logical outputs;
    a second logic plane having a number of non-volatile memory cells arranged in rows and columns that receive the outputs of the first logic plane and that are interconnected to produce a number of logical outputs such that the programmable logic array implements a logical function; and
    wherein the non-volatile memory cells each include a depletion mode p-channel memory cell, comprising:
        a control gate;
        a floating gate separated from the control gate by a dielectric layer, the floating gate including heavily doped silicon of one predominant carrier type; and
        an oxide layer of less than 50 Angstroms (Å), wherein the oxide layer separates the floating gate from a p-type doped channel region separating a source and a drain region in a substrate.

2. The programmable logic array of claim 1, wherein the first logic plane and the second logic plane each comprise NOR planes.

3. The programmable logic array of claim 1, wherein the oxide layer is approximately 30 Angstroms (Å).

4. The programmable logic array of claim 1, wherein the source region and the drain region include heavily doped, p+type source and drain regions.

5. The programmable logic array of claim 1, wherein the floating gate includes an n+type, heavily doped, polysilicon floating gate.

6. The programmable logic array of claim 1, wherein the control gate includes an n+type, heavily doped, polysilicon control gate.

7. The programmable logic array of claim 1, wherein the floating gate has a bottom surface area in contact with the oxide layer of approximately $10^{-10}$ cm$^2$.

8. A low voltage programmable logic array with ultra thin tunnel gate oxides, comprising:
    a first logic plane that receives a number of input signals, the first logic plane having a plurality of non-volatile memory cells arranged in rows and columns that are interconnected to provide a number of logical outputs;
    a second logic plane having a number of non-volatile memory cells arranged in rows and columns that receive the outputs of the first logic plane and that are interconnected to produce a number of logical outputs such that the programmable logic array implements a logical function; and
    wherein the non-volatile memory cells each include a depletion mode p-channel static device, comprising:
        a source region;
        a drain region;
        a channel region between the source and drain regions;
        a floating gate including heavily doped silicon of one predominant carrier type; and
        an oxide layer of less than 50 Angstroms (Å), wherein the oxide layer separates the floating gate from the channel region.

9. The low voltage programmable logic array with ultra thin tunnel gate oxides of claim 8, wherein the oxide layer is approximately 23 Angstroms (Å).

10. The low voltage programmable logic array with ultra thin tunnel gate oxides of claim 8, wherein the depletion mode p-channel static devices have a limited range of floating gate potentials or electron energies for which electrons can neither tunnel to the channel region or the source region nor electrons tunnel from the channel region or the source region to the floating gate.

11. The low voltage programmable logic array with ultra thin tunnel gate oxides of claim 10, wherein the limited range of floating gate potentials includes a range of +/−1.0 Volts.

12. The low voltage programmable logic array with ultra thin tunnel gate oxides of claim 10, wherein the limited range of floating gate electron energies for which electrons can neither tunnel to the channel region or the source region nor electrons tunnel from the channel region or the source region to the floating gate includes a charge on the order of approximately $10^{-7}$ Coulombs on the floating gates, and wherein the floating gates have a bottom surface area in contact with the oxide layer of approximately $10^{-10}$ cm$^2$.

13. A programmable logic array, comprising:
    a first logic plane that receives a number of input signals, the first logic plane having a plurality of non-volatile memory cells arranged in rows and columns that are interconnected to provide a number of logical outputs;
    a second logic plane having a number of non-volatile memory cells arranged in rows and columns that receive the outputs of the first logic plane and that are interconnected to produce a number of logical outputs such that the programmable logic array implements a logical function; and
    wherein the non-volatile memory cells each include a depletion mode p-channel floating gate transistor, comprising:
        a source region;
        a drain region;
        a channel region between the source and drain regions;
        a floating gate;
        an oxide layer of less than 50 Angstroms (Å), wherein the oxide layer separates the floating gate from the channel region; and
        wherein the transistor has a limited range of floating gate potentials or electron energies for which electrons can neither tunnel to the channel region or the source region nor electrons tunnel from the channel region or the source region to the floating gate.

14. The programmable logic array of claim 13, wherein at least one of the floating gate transistors is programmed with a minimal or no fixed charge on the floating gate over the limited range of floating gate potentials or electron energies such that the floating gate transistor is effectively removed from the array.

15. The programmable logic array of claim 13, wherein at least one of the floating gate transistors is programmed with a fixed charge on the floating gate over the limited range of floating gate potentials or electron energies.

16. The programmable logic array of claim 13, wherein the working surface of the substrate includes an insulating layer formed on top of an underlying semiconductor.

17. The programmable logic array of claim 13, wherein the programmable logic array is operatively coupled to a computer system.

18. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes a depletion mode p-channel floating gate transistor, comprising:
a control gate;
a floating gate separated from the control gate by a dielectric layer, the floating gate including heavily doped silicon of one predominant carrier type; and
an oxide layer of less than 50 Angstroms (Å), wherein the oxide layer separates the floating gate from a p-type doped channel region separating a source and a drain region in a substrate.

19. The programmable logic array of claim 18, wherein the first logic plane and the second logic plane each comprise NOR planes.

20. The programmable logic array of claim 18, wherein the oxide layer is approximately 30 Angstroms (Å).

21. The programmable logic array of claim 18, wherein each control gate in the first logic plane interconnects with one of the input lines.

22. The programmable logic array of claim 21, wherein each control gate in the second logic plane interconnects with one of the source and drain regions in the first logic plane.

23. The programmable logic array of claim 18, wherein the floating gate includes an n+type, heavily doped, polysilicon floating gate.

24. The programmable logic array of claim 18, wherein the control gate includes an n+type, heavily doped, polysilicon control gate.

25. The programmable logic array of claim 18, wherein the floating gate for the depletion mode p-channel floating gate transistor controls electrical conduction between the source regions and the drain regions.

26. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes a depletion mode p-channel floating gate transistor, comprising:
a control gate;
a floating gate separated from the control gate by a dielectric layer;
an oxide layer of less than 50 Angstroms (Å), wherein the oxide layer separates the floating gate from a p-type doped channel region separating a source and a drain region in a substrate and
wherein the transistor has a limited range of floating gate potentials or electron energies for which electrons can neither tunnel to the channel region or the source region nor electrons tunnel from the channel region or the source region to the floating gate.

27. The programmable logic array of claim 26, wherein at least one of the floating gate transistors is programmed with a minimal or no fixed charge on the floating gate over the limited range of floating gate potentials or electron energies such that the floating gate transistor is effectively removed from the array.

28. The programmable logic array of claim 26, wherein at least one of the floating gate transistors is programmed with a fixed charge on the floating gate over the limited range of floating gate potentials or electron energies.

29. The programmable logic array of claim 26, wherein the oxide layer is approximately 23 Angstroms (Å).

30. The programmable logic array of claim 26, wherein the limited range of floating gate potentials includes a range of +/−1.0 Volts.

31. The programmable logic array of claim 26, wherein the programmable logic array is a negative logic array.

32. An electronic system, the electronic system comprising a programmable logic array, the programmable logic array including:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes a depletion mode p-channel floating gate transistor, comprising:
a control gate;
a floating gate separated from the control gate by a dielectric layer;
an oxide layer of less than 50 Angstroms (Å), wherein the oxide layer separates the floating gate from a p-type doped channel region separating a source and a drain region in a substrate and
wherein the transistor has a limited range of floating gate potentials or electron energies for which electrons can neither tunnel to the channel region or the source region nor electrons tunnel from the channel region or the source region to the floating gate.

33. The electronic system of claim 32, wherein at least one of the floating gate transistors is programmed with a minimal or no fixed charge on the floating gate over the limited range of floating gate potentials or electron energies such that the floating gate transistor is effectively removed from the array.

34. The electronic system of claim 32, wherein at least one of the floating gate transistors is programmed with a fixed charge on the floating gate over the limited range of floating gate potentials or electron energies.

35. The electronic system of claim 32, wherein the oxide layer is approximately 23 Angstroms (Å).

36. The electronic system of claim 32, wherein the limited range of floating gate potentials includes a range of +/−1.0 Volts.

37. An electronic system, comprising:
a memory;
a processor coupled to the memory; and
wherein the processor includes at least one programmable logic array including:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes a depletion mode p-channel floating gate transistor, comprising:
a control gate;
a floating gate separated from the control gate by a dielectric layer;
an oxide layer of less than 50 Angstroms (Å), wherein the oxide layer separates the floating gate from a p-type doped channel region separating a source and a drain region in a substrate and
wherein the transistor has a limited range of floating gate potentials or electron energies for which electrons can neither tunnel to the channel region or the source region nor electrons tunnel from the channel region or the source region to the floating gate.

38. The electronic system of claim 37, wherein the processor is coupled to the memory on a single die.

39. The electronic system of claim 37, wherein at least one of the floating gate transistors is programmed with a minimal or no fixed charge on the floating gate over the limited range of floating gate potentials or electron energies such that the floating gate transistor is effectively removed from the array.

40. The electronic system of claim 37, wherein at least one of the floating gate transistors is programmed with a fixed charge on the floating gate over the limited range of floating gate potentials or electron energies.

41. The electronic system of claim 37, wherein the oxide layer is approximately 23 Angstroms (Å).

42. The electronic system of claim 37, wherein the limited range of floating gate potentials includes a range of +/−1.0 Volts.

43. A method for forming a programmable logic array, comprising:
forming a first logic plane that receives a number of input signals, wherein forming the first logic plane includes forming a plurality of non-volatile memory cells arranged in rows and columns that are interconnected to provide a number of logical outputs;
forming a second logic plane having a number of non-volatile memory cells arranged in rows and columns that receive the outputs of the first logic plane and that are interconnected to produce a number of logical outputs such that the programmable logic array implements a logical function; and
wherein forming the non-volatile memory cells includes forming depletion mode p-channel memory cell, forming the depletion mode p-channel memory cells, comprising:
forming a control gate;
forming a floating gate separated from the control gate by a dielectric layer, the floating gate including heavily doped silicon of one predominant carrier type; and
forming an oxide layer of less than 50 Angstroms (Å), wherein forming the oxide layer separates the floating gate from a p-type doped channel region separating a source and a drain region in a substrate.

44. The method of claim 43, wherein forming the floating gate includes forming the floating gate to have a limited range of floating gate potentials or electron energies for which electrons can neither tunnel to the channel region or the source region nor electrons tunnel from the channel region or the source region to the floating gate.

45. The method of claim 43, wherein forming the floating gate includes forming the floating gate such that when the floating gate is programmed with a minimal or no fixed charge on the floating gate over the limited range of floating gate potentials or electron energies, that the depletion mode p-channel memory cells is effectively removed from the array.

46. The method of claim 43, wherein forming the floating gate includes forming the floating gate such that when the floating gate is programmed with a fixed charge on the floating gate over the limited range of floating gate potentials or electron energies, that the depletion mode p-channel memory cells is effectively included in the array.

47. The method of claim 43, wherein forming the first logic plane and the second logic plane each comprise forming NOR planes.

48. The method of claim 43, wherein forming the oxide layer includes forming an oxide layer which is approximately 23 Angstroms (Å) thick.

49. The method of claim 43, wherein forming each control gate in the first logic plane includes forming the control gate to interconnect with one of the input lines.

50. The method of claim 43, wherein forming each control gate in the second logic plane includes forming the control gate to interconnect with one of the source and drain regions in the first logic plane.

51. The method of claim 43, wherein forming the floating gate includes forming an n+type, heavily doped, polysilicon floating gate.

52. A method for operating a programmable logic array comprising operating a programmable logic array having a number of non volatile depletion mode, floating gate, p-channel memory cells with ultra thin gate oxides, further comprising:
selectively storing a limited charge on at least one of the floating gates for the number of non volatile depletion mode, floating gate, p-channel memory cells, wherein selectively storing the limited charge on the at least one of the floating gates controls an electrical conduction between a source and a drain region for that non volatile depletion mode, floating gate, p-channel memory cell; and
applying a limited range of floating gate potentials to the number of non volatile depletion mode, floating gate, p-channel memory cells in the array.

53. The method of claim 52, wherein selectively storing a limited charge on at least one of the floating gates for the number of non volatile depletion mode, floating gate, p-channel memory cells includes applying a potential of less than 3.0 volts across the gate oxide for that memory cell.

54. The method of claim 53, wherein applying a potential of less than 3.0 volts across the gate oxide for that memory cell includes applying the potential for less than 200 nanoseconds.

55. The method of claim 52, wherein the method further includes selectively removing a limited charge on at least one of the floating gates for the number of non volatile depletion mode, floating gate, p-channel memory cells, wherein selectively removing the limited charge on the at least one of the floating gates effectively removes that non volatile depletion mode, floating gate, p-channel memory cell from the array.

56. The method of claim 55, wherein selectively removing a limited charge on at least one of the floating gates for the number of non volatile depletion mode, floating gate, p-channel memory cells includes applying a potential of less than 3.0 volts across the gate oxide for that memory cell.

57. The method of claim 56, wherein applying a potential of less than 3.0 volts across the gate oxide for that memory cell includes applying the potential for less than 200 nanoseconds.

58. The method of claim 52, wherein applying a limited range of floating gate potentials to the number of non volatile depletion mode, floating gate, p-channel memory cells in the array includes applying a limited range of floating gate potentials of approximately +/−1.0 Volts.

59. The method of claim 58, wherein applying a limited range of floating gate potentials of approximately +/−1.0 Volts includes applying the limited range of floating gate potentials of approximately +/−1.0 Volts for approximately 1.0 nanoseconds.

* * * * *